United States Patent
Spindler et al.

(10) Patent No.: US 11,844,230 B2
(45) Date of Patent: Dec. 12, 2023

(54) SPECTRALLY TUNABLE STACKED OLED

(71) Applicant: OLEDWorks LLC, Rochester, NY (US)

(72) Inventors: Jeffrey Spindler, Ontario, NY (US); Marina Kondakova, Kendall, NY (US)

(73) Assignee: OLEDWorks LLC, Rochester, NY (US)

( * ) Notice: Subject to any disclaimer, the term of this patent is extended or adjusted under 35 U.S.C. 154(b) by 171 days.

(21) Appl. No.: 17/172,398

(22) Filed: Feb. 10, 2021

(65) Prior Publication Data

US 2021/0296607 A1   Sep. 23, 2021

Related U.S. Application Data

(60) Provisional application No. 62/990,729, filed on Mar. 17, 2020.

(51) Int. Cl.
*H10K 50/13* (2023.01)
*H10K 50/11* (2023.01)
(Continued)

(52) U.S. Cl.
CPC ........... *H10K 50/131* (2023.02); *H10K 50/11* (2023.02); *H10K 50/81* (2023.02); *H10K 50/82* (2023.02);
(Continued)

(58) Field of Classification Search
None
See application file for complete search history.

(56) References Cited

U.S. PATENT DOCUMENTS

2013/0146850 A1* 6/2013 Pieh .................... H01L 51/5044
257/40
2014/0167016 A1* 6/2014 Yoo .................... H01L 51/5056
257/40

(Continued)

FOREIGN PATENT DOCUMENTS

WO        2010/140549 A1    12/2010

OTHER PUBLICATIONS

Zhao et al., "Emission Spectral Stability Modification of Tandem Organic Light-Emitting Diodes through Controlling Charge-Carrier Migration and Outcoupling Efficiency at Intermediate/Emitting Unit Interface", ACS Omega 2018, 3, 3348-3356.

(Continued)

*Primary Examiner* — Daniel Whalen

(57) ABSTRACT

An OLED lighting device comprising: a blue light-emitting unit with a blue-light fluorescent, phosphorescent or TADF emitter; a yellow light-emitting electroluminescent unit comprising a green phosphorescent emitter, a red phosphorescent emitter and at least one non-emitting host; wherein the blue light-emitting unit and the yellow light-emitting unit are separated by a mixed interlayer with two non-emitting charge-carrier materials. Desirably, the yellow-light emitting unit essentially consists of a green phosphorescent emitter, a red phosphorescent emitter and a single non-emitting host. The mixed interlayer desirably has more than 50% of a hole-transporting material and an electron-transporting material. The Triplet Energy of both materials in the mixed interlayer can be higher than the Triplet Energies of the R and G phosphorescent dopants. The HOMOs of both materials in the mixed interlayer are more negative than the HOMO of the host in the yellow unit but less negative than the HOMO of the host in the blue unit. The LUMOs of the materials in the mixed interlayer can be more negative than the LUMO of the host in the yellow unit (Continued)

but less negative than the LUMO of the host in the blue unit. The OLED lighting device is spectrally tunable according to the supplied power.

12 Claims, 10 Drawing Sheets

(51) Int. Cl.
*H10K 50/81* (2023.01)
*H10K 50/82* (2023.01)
*H10K 101/10* (2023.01)
*H10K 101/30* (2023.01)
*H10K 102/00* (2023.01)

(52) U.S. Cl.
CPC ..... *H10K 2101/10* (2023.02); *H10K 2101/30* (2023.02); *H10K 2102/3035* (2023.02)

(56) References Cited

U.S. PATENT DOCUMENTS

2015/0188066 A1* 7/2015 Song .................. H10K 50/15
257/40

2016/0181561 A1* 6/2016 Lee .................. H10K 50/131
257/40

OTHER PUBLICATIONS

Harvard Health Letter, "Blue light has a dark side", Harvard Health Publishing, Harvard Medical School, Published May 2012; Updated Jul. 7, 2020.

Hou et al., "Highly Efficient and Stable Hybrid White Organic Light Emitting Diodes with Controllable Exciton Behavior by a Mixed Bipolar Interlayer", Chin. Phys. Lett., vol. 33, No. 7 (2016) 077801.

Hatwar et al., "Organic Electronics", Chapter 14, pp. 433-510, "OLED Materials and Device Architectures for Full-Color Displays and Solid-State Lighting".

Regency Lighting, "What is CCT? A guide to choosing correlated color temperature for your lighting", Lighting Insights Blog, https://insights.regencylighting.com/what-is-correlated-color-temperature-cct-and-how-do-you-choose-it-for-your-lighting, accessed Jan. 17, 2021.

* cited by examiner

| 21 |
| 19 |
| 17 |
| 15 |
| 13 |
| 11 |
| 9 |
| 7 |
| 5 |
| 3 |
| 1 |

SPECTRALLY TUNABLE STACKED OLED

CROSS REFERENCE TO RELATED APPLICATION

This application claims the benefit of U.S. Provisional Application No. 62/990,729, filed Mar. 17, 2020.

GOVERNMENT INTEREST

This invention was made with Government support under Award DE-EE0008211 by the US Department of Energy. The Government has certain rights in this invention.

BACKGROUND

LED and OLED lighting panels offer many advantages for general lighting purposes. They are efficient in terms of light output for power consumed. They are low voltage which helps avoid potential electrical shocks, less prone to sparking in potentially explosive environments and reduce loads in the supporting electrical system. The spectrum of emitted light can be varied using appropriate internal designs. They produce little or no UV or IR light. They are instant on; that is, they emit light immediately whenever electrical power is supplied.

LED light sources are inherently small point sources and in order to serve as a flat general lighting source, many separate LED devices must be ganged together. This raises manufacturing costs and complexity. Uniformity of the light surface must be controlled by appropriate design. LEDs produce some heat and so, heat sinks or other thermal control measures are often employed. Practical LED lighting panels can be made very thin, for example as thin as 3-16 mm, with appropriate system design.

OLED light sources are inherently flat area light sources. They offer several advantages over LED lighting panels. They can be made even thinner (for example, less than 1 mm thick) and they produce very little heat under normal operating conditions. However, OLED lifetimes can be an issue. Both LED and OLED lighting panels can be made on flexible or curved substrates even though OLED is preferred for these types of applications.

In summary, both LED and OLED lighting panels can be useful as lighting panels. They are both efficient, low voltage, cool to the touch, and are thin. Luminaires (a complete device with a light source (i.e. a lamp) and a support component (i.e. a lamp holder) that provides light and illumination) can be designed to utilize flat LED or OLED lighting panels.

The nature of light emitted from any lighting source can be expressed in terms of color temperature or correlated color temperature. The color temperature of a light source is the temperature of an ideal black-body radiator that radiates light of a color comparable to that of the light source. The correlated color temperature (CCT, Tcp) is the temperature of the Planckian radiator whose perceived color most closely resembles that of a given stimulus at the same brightness and under specified viewing conditions. While color temperature (CCT) is often used to represent the chromaticity of white light sources, chromaticity is two-dimensional, and another dimension, the distance from the Planckian locus (black-body radiator), is often missing. Duv (Delta u'v'), as defined in ANSI C78.377, can be used for this purpose and the combination of CCT and Duv can be used as an intuitive expression of chromaticity of white light sources for general lighting. Color temperature is conventionally expressed in kelvins, using the symbol K, a unit of measure for absolute temperature.

Color temperatures over 5000 K are often called "cool" colors (bluish), while lower color temperatures (2700-3000 K) are often called "warm" colors (yellowish). "Warm" in this context is an analogy to radiated heat flux of traditional incandescent lighting rather than temperature. "Cool" colors will have a higher ratio of blue light to green and red light whereas "warm" colors will be deficient in blue light relative to green and red light. The following table gives some typical examples of CCT values for various lighting conditions.

| Temperature | Source |
| --- | --- |
| 1700 K | Match flame, low pressure sodium lamps (LPS/SOX) |
| 1850 K | Candle flame, sunset/sunrise |
| 2400 K | Standard incandescent lamps |
| 2550 K | Soft white incandescent lamps |
| 2700 K | Soft white compact fluorescent and LED lamps |
| 3000 K | Warm white compact fluorescent and LED lamps |
| 3200 K | Studio lamps, photofloods, etc. |
| 3350 K | Studio "CP" light |
| 5000 K | Horizon daylight |
| 5000 K | Tubular fluorescent lamps or cool white/daylight CFLs |
| 5500-6000 K | Vertical daylight, electronic flash |
| 6200 K | Xenon short-arc lamp |
| 6500 K | Daylight, overcast |
| 6500-9500 K | LCD or CRT screen |
| 15,000-27,000 K | Clear blue poleward sky |

*from https://en.wikipedia.org/wiki/Color temperature

Another method of describing the color of light is by its position in the CIE XYZ color space, which is widely used to specify colors in practice. The chromaticity is then specified by the two derived parameters x and y which are functions of the tristimulus values X, Y, and Z. The $CIE_{x,y}$ values are often plotted in a two-dimensional space called the chromaticity diagram, which represents (in part) the gamut of human vision. The outside edge of the gamut, except for the bottom "line of purples", is called the spectral locus and corresponds to monochromatic light (each point representing a pure hue of a single wavelength). Less saturated colors appear in the interior of the figure with white at the center. If one chooses any two points of color on the chromaticity diagram, then all the colors that lie in a straight line between the two points can be formed by mixing these two colors. All colors that can be formed by mixing multiple sources are found inside the triangle formed by the source points on the chromaticity diagram.

The CIE color rendering index (CRI) is another method of expressing the nature of emitted light. CRI is based on the determination of how well a light source's illumination of eight sample patches compares to the illumination provided by a reference source. Note that CCT alone does not describe anything about the color rendering ability of the light source, but cited together, the CRI and CCT can give a numerical estimate of the difference between a reference (ideal) light source and a particular light source.

Light sources and illuminants may also be characterized by their spectral power distribution (SPD). These are plots of spectral power (intensity) versus wavelength.

Any of the above methods would be suitable to characterize the spectral-tunable aspect of the invention.

However, the choice of the nature of light emitted from a lighting panel often depends on the needs and use of the application which is being illuminated. For example, see "What is CCT? A guide to choosing correlated color temperature for your lighting"; https://insights.regencylighting.com/what-is-correlated-color-temperature-cct-and-how-do-you-choose-it-for-your-lighting, posted 2020.

In many lighting applications, it is very desirable that, whatever color temperature of the emitted light is, it remains constant and unchanging over all brightness levels and length of use. LEDs are particularly suitable for these types of applications since the CCT of the emitted light is generally constant. In part, this is because brightness for LEDs are typically controlled by PWM (pulse-width modulation) where the amount of current supplied to the LED is constant, and the total amount of brightness is determined by the length of time of the LED is powered. Moreover, LEDs are very stable and the CCT does not shift much over the lifetime of the LED.

However, for other lighting applications, it is very desirable that the color temperature of the emitted light can be intentionally varied to a desired CCT.

For example, a circadian rhythm is a natural, internal process that regulates the sleep-wake cycle and repeats roughly every 24 hours. However, circadian cycles can be affected by environmental conditions such as the level of sunlight exposure. The levels of the hormone melatonin are dependent on the body's circadian rhythm. As the level of sunlight exposure decreases, melatonin production increases. However, generally speaking, people can be exposed to a greater degree of artificial lighting and so, the natural circadian rhythm can be disrupted. In particular, it is thought that the amount of blue light may be important to the disruption (for example, see "Blue light has a dark side", https://www.health.harvard.edu/staying-healthy/blue-light-has-a-dark-side; posted 2018). Thus, lighting that can shift in CCT to a "warmer" (less blue light) color at some period of time relative to other times would be desirable to prevent circadian rhythm issues.

LEDs are not particularly suitable for applications in which the CCT is intentionally varied and in particular, not suitable for reducing circadian rhythm issues. White light-emitting LEDs inherently emit a relatively large amount of blue light, which is internally down-converted to create some green and red light. U.S. Pat. No. 10,278,252, US2010/0179469, US2019/0160252, WO 2017/210461 and US2017/0238401 describe luminaires that reduce circadian rhythm issues by using multiple light sources of different colors, where the CCT of the emitted light is varied by changing the ratio of which sources are activated.

Stacked white light-emitting OLEDs are particularly suitable for applications with a single light source where the CCT of the emitted light is intentionally varied. A stacked OLED is an OLED with multiple individual light-emitting units (or layers), each of which can emit a different color of light, stacked one on top of another, between an anode and a cathode. If the amount of light produced by a light-emitting unit of one color relative to the amount of light produced by a second light-emitting unit of another color can be changed, then the CCT of the outputted light can be varied.

It is possible to stack individual OLEDs, each with a separately controllable anode and cathode, on top of each other. For example, M. Fröebel et al, "Get it white: color-tunable AC/DC OLEDs", Light: Science & Applications, 4, e247 (2015) describes stacked devices with separately driven blue and yellow OLEDs that are color-tunable; and H. Lee et al, "Color-tunable organic light-emitting diodes with vertically stacked blue, green, and red colors for lighting and display applications", Optics Express, 26(14), 18351 (2018) describes stacked devices with separately driven R, G and B OLEDs that are color-tunable. Such devices are inefficient and expensive to manufacture.

Within a stacked OLED where the units are not separately controlled by their own anode and cathode, the amount of light emitted from each individual light-emitting unit will depend on the amount of charge carriers (holes and electrons) flowing across the unit. Since the units are stacked on top of each other, the amount of charge carriers each unit sees depends on their location (both relative to other units as well as to the electrodes) as well as the organic layers that separate each unit. The amount of charge carriers that are present within the OLED is dependent on the voltage and/or current that is applied between the anode and cathode. Generally, transfer of charge carriers can be controlled by selection and design of the stacked OLED and so, stacked OLEDs with variable CCT are known.

U.S. Pat. No. 6,614,176 teaches white OLEDs with fluorescent B and Y units separated by a buffer layer of varying thickness to adjust the color balance. U.S. Pat. No. 8,339,036 teaches white OLEDs with a fluorescent B unit and a phosphorescent Y unit (as separate G and R layers) separated by a buffer layer where the color balance changes as a function of voltage and/or current. U.S. Ser. No. 10/290,825 teaches white OLEDs with a fluorescent B unit and a phosphorescent Y unit separated by an "intermediate layer" formed of a "non-fluorescent and non-phosphorescent material that can transport holes and charges". U.S. Pat. No. 8,941,297 describes a stacked OLED with a first blue light-emitting unit with a fluorescent emitter, and a second yellow light-emitting unit with a phosphorescent emitter with two hosts, the two units being separated by an interlayer with at least two different materials. The emission color can be tuned to a specific CIE coordinate over a very broad range by changing the mixing ratio in the interlayer. Dependence of the color of emission on applied voltage or current is not mentioned. WO2010140549A1 discloses white OLEDs with a blue light-emitting layer directly adjacent to an orange light-emitting layer where the color temperature can be varied in part by controlling the supplied power.

D. Zhao et al, "Emission Spectral Stability Modification of Tandem Organic Light-Emitting Diodes through Controlling Charge-Carrier Migration and Outcoupling Efficiency at Intermediate/Emitting Unit Interface", ACS Omega, 3, 3348-3356 (2018) describe a stacked OLED with a blue light-emitting unit and a red light-emitting unit separated by a mixed compound charge transfer layer where the CIE coordinates of the emitted light change as a function of the applied voltage. T. K. Hatwar et al, "OLED Materials and Device Architectures for Full-Color Displays and Solid-State Lighting"; Chapter 14 in Organic Electronics: Materials, Processing, Devices and Applications, edited by Franky So, 2009; p. 454 describes a stacked OLED with a first blue light-emitting unit with a fluorescent emitter, and a second yellow light-emitting unit with a phosphorescent emitter with two hosts, the two units being separated by an interlayer with at least two different materials. The emission color is changed according to the mixing ratio in the interlayer. Y. Y. Hou et al, Chin. Phys. Let., 33(7), 077801 (2016) describes white OLED with a mixed interlayer between two emitting layers. In all of the above references, dependence of the color of emission on applied voltage or current is not mentioned.

Voltage- or current-dependent color shifts can be the result of a variety of mechanisms, e.g., voltage-dependent charge trapping, a spatial shift of the recombination zone, a modified exciton distribution, or exciton quenching at high current densities. However, this approach has several drawbacks: not only are the mechanisms that lead to voltage-dependent color-shifts difficult to control, but adjusting the driving voltage also unavoidably results in a dramatic and undesired change in device brightness.

It would be desirable to have a stacked OLED lighting device that is spectrally tunable according to the supplied power. In particular, it would be desirable to have a stacked OLED lighting device that is capable of emitting both at a "cool" CCT (about 5000K) as well as a "warm" CCT (about 2700K) according to the amount of power supplied. Alternatively, in some cases, it might be desirable that the stacked OLED lighting device be capable of emission both at a "warm" CCT and an even "warmer" CCT (for example, 1600-1800K). In some applications, it would be desirable that the brightness of both the "cool" and "warm" emissions be the same. In other applications, it would be desirable where the brightness decreases between the higher CCT emission to the lower CCT emission.

SUMMARY OF IMPORTANT FEATURES

Some of the important features of the invention include:
An OLED lighting device comprising:
  a blue light-emitting unit with a blue-light fluorescent, phosphorescent or TADF (thermally active delayed fluorescent) emitter;
  a yellow light-emitting electroluminescent unit comprising a green phosphorescent emitter, a red phosphorescent emitter and at least one non-emitting host;
  wherein
  the blue light-emitting unit and the yellow light-emitting unit are separated by a mixed interlayer with two non-emitting charge-carrier materials.

The above OLED device wherein the yellow-light emitting unit contains a single layer that essentially consists of a green phosphorescent emitter, a red phosphorescent emitter and a single non-emitting host.

A stacked spectrally-tunable OLED lighting device comprising, in order:
  a transparent substrate;
  a transparent anode;
  a blue light-emitting OLED unit with at least one electroluminescent unit with a blue-light fluorescent, phosphorescent or TADF emitter;
  a mixed interlayer with two non-emitting charge-carrier materials;
  a yellow light-emitting OLED unit comprising a green phosphorescent emitter, a red phosphorescent emitter and at least one non-emitting host; and
  a reflective cathode.

The above stacked spectrally-tunable OLED lighting device wherein the yellow light-emitting OLED unit contains at least one layer that essentially consists of a green phosphorescent emitter, a red phosphorescent emitter and a single non-emitting host.

The above OLED devices wherein the first of the non-emitting charge carriers in the mixed interlayer is a hole-transporting material and the second is an electron-transporting material. The hole-transporting material may represent more than 50% of the materials in the layer by weight.

The above OLED devices wherein the blue light-emitting unit has a blue-light fluorescent or TADF emitter; and preferably a fluorescent blue emitter.

The above OLED devices wherein there are two or more blue light-emitting electroluminescent units, each with a blue-light fluorescent, phosphorescent or TADF emitter, that are either directly adjacent or are separated by a non-emitting interlayer. Desirably (in some embodiments?), the blue electroluminescent units each essentially consists of a blue fluorescent, phosphorescent or TADF emitter and a single non-emitting host in a single layer.

The above OLED devices wherein there are two or more yellow light-emitting electroluminescent units, each comprising a green phosphorescent emitter, a red phosphorescent emitter and at least one non-emitting host wherein the two yellow units can be either directly adjacent or are separated by an interlayer. Desirably, the yellow electroluminescent units each essentially consists of a green phosphorescent emitter, a red phosphorescent emitter and a single non-emitting host in a single layer.

The above OLED devices where there are at least two white light-emitting OLED units, each white light-emitting unit comprising a blue light-emitting OLED unit with at least one electroluminescent layer with a blue-light fluorescent, phosphorescent or TADF emitter; an interlayer with two non-emitting charge-carrier materials; and a yellow light-emitting OLED unit comprising a green phosphorescent emitter, a red phosphorescent emitter and at least one non-emitting host; wherein the white light-emitting OLED units are separated by a charge-generating unit. Desirably, the yellow electroluminescent units in each of the W light-emitting units essentially consist of a green phosphorescent emitter, a red phosphorescent emitter and a single non-emitting host in a single layer.

Any of the OLED lighting devices as above where the yellow light-emitting OLED unit comprises at least two light-emitting layers; a first electroluminescent layer comprising a green phosphorescent emitter and a non-emitting host that is directly adjacent to a second electroluminescent layer comprising a red phosphorescent emitter and a non-emitting host.

Any of the OLED lighting devices as above where the yellow light-emitting OLED unit comprises at least two light-emitting layers, with an electroluminescent layer comprising a green phosphorescent emitter and a non-emitting host is separated by an interlayer from an electroluminescent layer comprising a red phosphorescent emitter and a non-emitting host.

The Triplet Energy of both materials in the mixed interlayer can be higher than the Triplet Energies of the R and G phosphorescent dopants in the neighboring Y unit.

The HOMOs (highest occupied molecular orbital) of both materials in the mixed interlayer are more negative than the HOMO of the host in the neighboring Y unit but less negative than the HOMO of the host in the neighboring B unit. Moreover, the LUMOs (lowest unoccupied molecular orbital) of the materials in the mixed interlayer can be more negative than the LUMO of the host in the Y unit but less negative than the LUMO of the host in the B unit.

BRIEF DESCRIPTION OF THE DRAWINGS

FIG. 1 shows a schematic diagram for a stacked OLED device 100 according to the invention.

DETAILED DESCRIPTION

Figure 2:
FIG. 2 shows a schematic diagram for a stacked OLED device 200 according to the invention.

For the purposes of this disclosure, the terms "over" or "above" mean that the structure involved is located above another structure, that is, on the side opposite from the substrate. "Uppermost" or "upper" refers to a side or surface furthest from the substrate while "bottommost" or "bottom" refers to the side or surface closest to the substrate. "Interior" or "inner" refers to the side or surface of a layer that its closest to the organic layers within the microcavity. Unless otherwise noted, "over" should be interpreted as either that the two structures may be in direct contact or there may be intermediate layers between them. By "layer", it should be understood that a layer has two sides or surfaces (an uppermost and bottommost). "LEL" always refers to a single light-emitting layer. A light-emitting "unit" generally refers to a layer or group of adjacent layers that are considered to act as one single source of light; a single LEL may be referred to as a "unit", but a "unit" may also contain one LEL associated with other non-emitting layers that are considered as a whole, or may have multiple LELs with or without additional layers. A stacked OLED device may have multiple units or combinations of units and LELs, that together make up the total emission. In some embodiments, multiple light-emitting units can be part of a larger grouping.

R indicates a layer or unit that primarily emits red light (>600 nm, desirably in the range of 620-660 nm), G indicates that a layer or unit primarily emits green light (500-600 nm, desirably in the range of 540-565 nm) and B indicates a layer or unit that primarily emits blue light (<500 nm, desirably in the range of 440-485 nm). It is important to note that R, G and B layers can produce some degree of light outside the indicated range, but the amount is always less than the primary color. Y (yellow) indicates that a layer or unit that emits significant amounts of both R and G light with a much lesser amount of B light. Unless otherwise noted, wavelengths are expressed in vacuum values and not in-situ values.

"Spectrally-tunable" (or color-tunable) means that in the stacked OLED lighting device, the spectrum (luminance vs wavelength) is manipulated (by controlling via the power supplied) to achieve a desired overall emission. In other words, it means to change the spectral power distribution by changing the wavelengths and magnitudes of the light emitted from the device as a function of the voltage and/or current that is supplied to the device from an external power source. "Spectrally-tunable" may involve incremental and barely noticeable changes in emitted "color" between two sets of different "colors" or may involve discrete jumps from one "color" to another "color" without intermediate degrees.

The stacked OLED devices produce more than one color of light and so, are multimodal OLEDs. Ideally, a multimodal OLED produces a white light with roughly equal amounts of R, G and B light. Typically, this would correspond to $CIE_x$, $CIE_y$ values of approximately 0.33, 0.33. White light, even if does not contain equal amounts of R, G, B light, can generally be produced in OLEDs by having three separate R, G and B light-emitting layers, two separate light emitting layers such as blue and yellow, or even a single white light-emitting layer. In the case of the stacked OLED lighting device of the invention, there is at least one yellow light-emitting OLED layer or unit and at least one blue light-emitting OLED layer or unit, which are separated by a mixed interlayer.

An OLED light-emitting unit produces a single "color" of light (i.e. R, G, B, or a combination of 2 primary colors such as Y or C (cyan), or W). The individual OLED light-emitting units may have a single light-emissive layer or may have more than one light-emitting layer (either directly adjacent to each other or separated from each other by an interlayer). The individual light-emitting units may also contain various kinds of non-emitting layers such as hole transporting layers, electron-transporting layers, blocking layers and others known in the art to provide desirable effects such as promoting emission and managing charge transfer across the light-emitting unit. The single color of light may be generated within the OLED unit by a single layer with one or more emitters of the same color or multiple layers, each with the same or different emitters whose primary emission fall within the same color.

The single color provided by the OLED unit can be a combination of two primary colors; in particular, a yellow light-emitting OLED unit that produces a combination of R and G light. In this case, yellow counts as a single color. In the case of the stacked OLED lighting device of the invention, the yellow light is generated by a Y unit that can at least one single LEL that emits yellow (R+G) light by a combination of R and G emitters, or by a combination of separate layers that together emits yellow (R+G) light, each layer separately emitting R or G. In particular, a yellow unit may be two directly adjacent layers: a green-light emitting layer with a green-light emitting dopant with a non-emitting host and red-light emitting layer with a red-light emitting dopant with a non-emitting host. Desirably, both the R emitting layer and the G emitting layer each have a single host, and desirably, the same host. A single yellow phosphorescent material that emits both green and red light is not suitable for the purposes of the invention and is specifically excluded.

OLED lighting devices or panels used for general illumination purposes feature a uniform area of light emission. OLED lighting panels are available in different shapes, sizes and thicknesses on their own substrate. For example, such lighting panels can be rectangular (including rectangles with rounded edges), square, round, oval or triangular. The size used is generally large enough to provide a sufficient amount of light for the design needs. If the design requires additional light than can be provided by a single panel, multiple lighting panels, wired in either series or parallel and with one single controller or with individual controllers, can be used.

Figure 1:
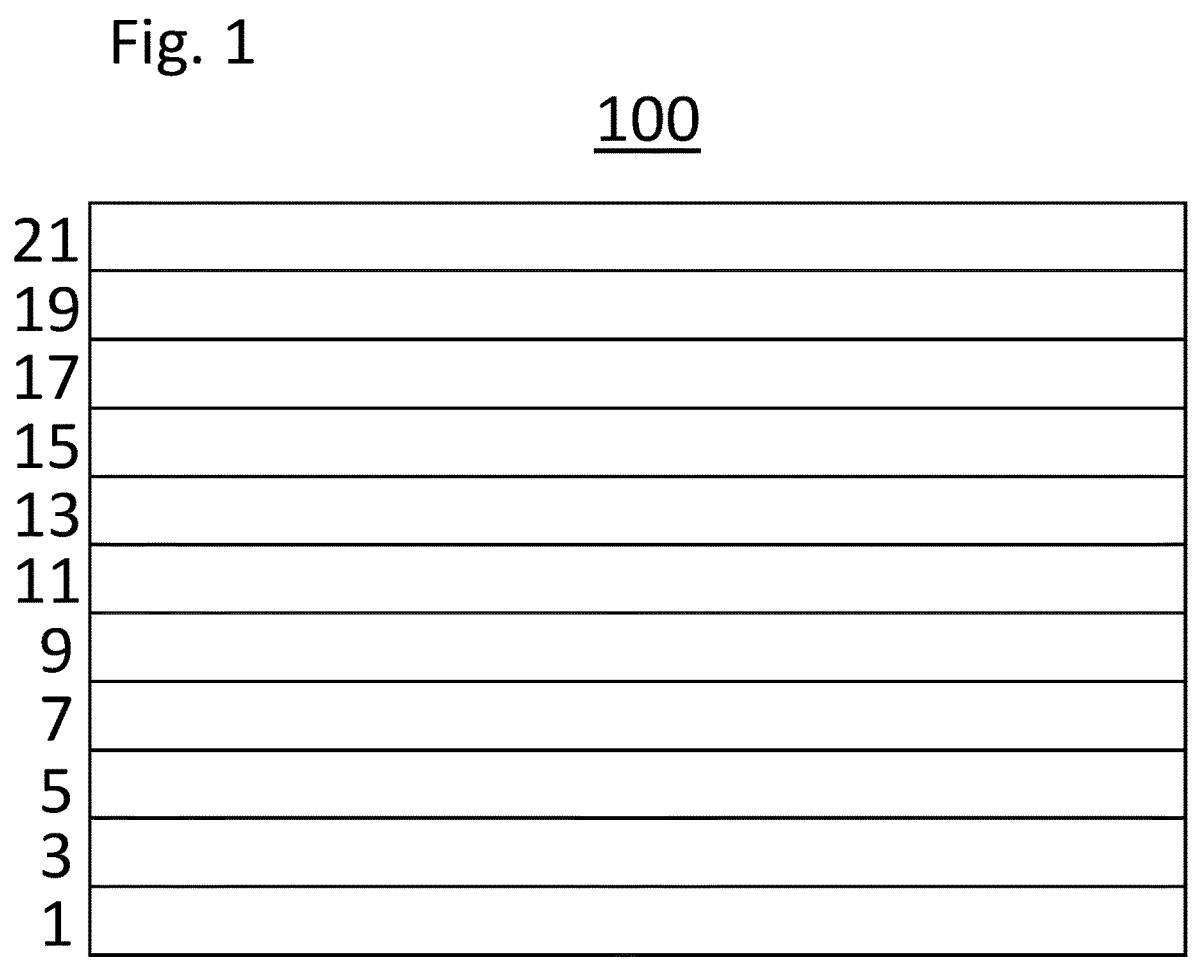

FIG. 1 illustrates a first embodiment 100 of a spectrally-tunable stacked OLED lighting device. On top of the transparent substrate 1, there is (in order): a transparent anode 3, a hole-injection layer 5, a hole-transport layer 7, a blue light-emitting OLED unit 9, a mixed interlayer 11, a yellow light-emitting OLED unit 13, an electron-transport layer 15, an electron-injection layer 17, a reflective cathode 19 and encapsulation 21.

The transparent substrate 1 can be glass (including flexible glass) or polymeric materials. Generally speaking, it will be flat with a uniform thickness. The top surface of the substrate is that facing the OLED. Since the substrate will be part of the overall encapsulation for the OLED, it should be sufficiently impervious to air and water so that the OLED will have desired lifetime. The substrate can be rigid or flexible. Flexible substrates are preferred for roll-to-roll applications, although this is not necessary. The substrate may have various types of subbing layers (i.e. planarization layers, light management layers, etc.) which may be patterned or unpatterned and can be either on the top or bottom surfaces.

There is a first transparent anode 3 that covers the top surface of the substrate and desirably completely covers the top surface of the substrate. It should be noted that "completely covers the top surface" refers only to that the first electrode is unpatterned and runs continuously and unbroken in all directions over that part of the surface of the substrate that will contain the active areas of the device including the inside and outside areas. There could be some parts of the substrate that are not covered by the transparent first electrode. For example, there can still be a small border of uncovered top surface of the substrate along the edges of the substrate which will not be part of the finished device.

The stacked OLED lighting device is desirably a bottom emitter. The transparent first electrode should transmit as much light as possible, preferably having a transmittance of at least 70% or more desirably at least 80%. However, in some applications (i.e. microcavity devices), the transparent first electrode may only be semi-transparent and have partial reflectivity. While the first transparent electrode may be made of any conductive materials, metal oxides such as ITO or AZO or thin layers of metals such as Ag are preferable. In some cases, there may be an auxiliary electrode to help distribute charge more uniformly across the full plane of the transparent electrode.

Over the transparent electrode, there may be located hole-injection 5 or hole-transport layers 7 as needed. Hole-injection and -transport materials suitable for use in non-emitting layers are well-known and commonly used. These layers may be mixtures of such materials and may contain dopants to modify their properties. Since they are non-light emitting, they do not contain emitting materials and are transparent. The choice of appropriate materials is not critical and any may be selected based on their performance.

Over the hole-injection and hole-transport layers, there is a blue light-emitting OLED unit 9. In this case of 100 in FIG. 1, the blue light-emitting OLED unit is a single blue light-emitting layer, which is desirable. A blue light-emitting layer will typically comprise a host material (or a mixture of host materials) and a blue light emitter. Blue phosphorescent emitters would be very suitable, but currently known examples do not have adequate stability. For this reason, fluorescent and TADF (thermally active delayed fluorescent) blue emitters are particularly useful for this invention, with blue fluorescent materials being preferred. While B emission is generally <500 nm, preferred ranges for blue emission from the blue emitting material are 440-485 nm, more preferably 445-475 nm and most preferably 450-470 nm. These preferred wavelength ranges are governed by the blue emitters available, the photopic response of the eye (longer wavelengths appear brighter), and the color gamut requirements for the device (shorter wavelengths give a larger gamut). Desirably, the host for the blue-light emitting LEL can be electron-transporting. Host materials and fluorescent, phosphorescent and TADF blue light-emitting materials suitable for use in blue light-emitting layers or units are well-known and commonly used. The choice of appropriate materials is not critical and any may be selected based on their performance and emission characteristics.

Over the blue light-emitting unit is a non-emitting mixed interlayer 11 with at least two non-emitting charge-carrier materials. Desirably, there are only two charge-carrier materials in a single layer. Desirably, at least one of the charge-carrier materials is a hole-transporting material and at least one of the other is an electron-transport material. Mixed interlayer 11 is not doped; that is, it does not contain any electron- or hole-generating materials nor any material that forms a charge-transfer complex with any of the non-emitting charge-carrier materials. It does not contain any metal or inorganic compounds. Desirably, the mixed interlayer 11 consists of only one hole-transporting material and only one electron-transport material and essentially no other materials. The hole-transporting material may represent more than 50% of the materials in the layer by weight. Desirably, the % of the hole-transporting material in the mixed interlayer is at least 75% or greater. Hole- and electron-injection and -transport materials suitable for use in non-emitting layers are well-known and commonly used. The choice of appropriate materials is not critical and any may be selected based on their performance.

It is desirable that the Triplet Energy of both the materials in the mixed interlayer are higher than the Triplet Energies of the R and G phosphorescent dopants in the yellow light-emitting layer or unit. This can be an important consideration in achieving spectral tuning of the OLED based on the current applied.

It is also desirable that the HOMOs of the materials in the mixed interlayer are more negative than the HOMO of the host in the yellow layer or unit but less negative than the HOMO of the host in the blue layer. Moreover, the LUMOs of the materials in the mixed interlayer should be more negative than the LUMO of the host in the yellow layer or unit but less negative than the LUMO of the host in the blue layer or unit as well. These HOMO and LUMO relationships can be an important consideration in achieving spectral tuning of the OLED based on the current applied.

Over the mixed interlayer is a yellow light-emitting OLED unit 13 with at least one electroluminescent layer consisting essentially of a green phosphorescent emitter, a red phosphorescent emitter and a single non-emitting host. In this embodiment, the yellow light-emitting OLED 13 unit is a single layer containing both green and red phosphorescent emitters with a single non-emitting host. Desirably, the single non-emitting host for the yellow LEL is hole-transporting. Host materials and red and green phosphorescent emitters suitable for use together in yellow light-emitting layers or units are well-known and commonly used. The choice of appropriate materials is not critical and any may be selected based on their performance and emission characteristics.

It should be noted that the yellow light-emitting OLED unit 13 does not contain a single phosphorescent material that emits both green and red light. A material that inherently emits yellow light is not suitable for providing a spectrally tunable device to the desired degree. It is important that there are separate red and green emitters so that the relative contribution of each to the overall emitted light can be varied by changes in the power supplied.

Over the yellow light-emitting OLED unit, there may be located electron-transport 15 or electron-injection 17 layers as needed. Electron-injection and -transport materials suitable for use in non-emitting layers are well-known and commonly used. These layers may be mixtures of such materials and may contain dopants to modify their properties. Since they are non-light emitting, they do not contain emitting materials and are transparent. The choice of appropriate materials is not critical and any may be selected based on their performance.

Over the organic layers, there is a second electrode 19 which desirably is a reflective cathode It is desirably composed of a thicker layer of metal or metal alloy such as Al, Ag, Mg/Al, Mg/Ag and the like. The second electrode may be deposited by any known technique. The second electrode may be patterned in non-emissive areas, but generally is deposited uniformly over the emission area.

There may be optional protective or spacing layers over the second electrode to prevent damage during encapsulation. These are not shown in FIG. 1.

Over the reflective cathode and any optional protective layers, if present, is deposited or placed encapsulation 21. At a minimum, the encapsulation should fully cover the light-emitting area on the top and sides and is in direct contact with the substrate. The encapsulation should be impervious to air and water penetration. It may be transparent or opaque. It should not be electrically conductive. It may be formed in-situ or added as a separate pre-formed sheet along with provisions for sealing the side edges.

An example of in-situ formation would be thin-film encapsulation. Thin-film encapsulation involves the deposition of multiple layers with alternative layers of inorganic materials and polymeric layers until the desired degree of protection is achieved. Formulations and methods to form thin-film encapsulation are well known and any can be used as desired.

Alternatively, encapsulation may be provided using a pre-formed sheet or cover slip which is attached over at least the sealing area and enclosed area. The pre-formed sheet may be rigid or flexible. It could be made of glass (including flexible glass), metal or organic/inorganic barrier layers. It should have a thermal expansion coefficient that is close to the substrate to achieve a more robust connection. Pre-formed encapsulation sheets may need to be attached over the sealing area using air- and water-proof adhesives such as silicon or epoxy adhesives or by thermal means such as ultrasonic welding or glass frit welding, which may require additional sealants such as solder or glass frit. The side and bottom edges of the cover slip can be specially designed to have better fit to the sealing area or promote a better seal. The cover slip and sealing area may be designed together so that they fit or lock partially in place before the seal is formed. Moreover, the cover slip may be pretreated to promote better adhesion to the sealing area.

FIG. 2 illustrates a second embodiment 200 of a spectrally-tunable OLED lighting device. This embodiment is the same as 100 shown in FIG. 1 except that the blue light-emitting unit 9 has two separate and adjacent blue light-emitting layers 9A and 9B. The two adjacent blue LELs may have the same formulation, but desirably have different formulations. In particular, the blue light-emitters in 9A and 9B can have blue emission that are spectrally different. This allows for more and broader overall blue emission for the blue light-emitting unit 9. The non-emitting hosts in 9A and 9B may be the same or different. In some related embodiments, there may be a non-emitting interlayer between 9A and 9B. The interlayer may only have one material, either a hole-transporting material or an electron-transporting material, or a mixture of the two materials.

Figure 3:
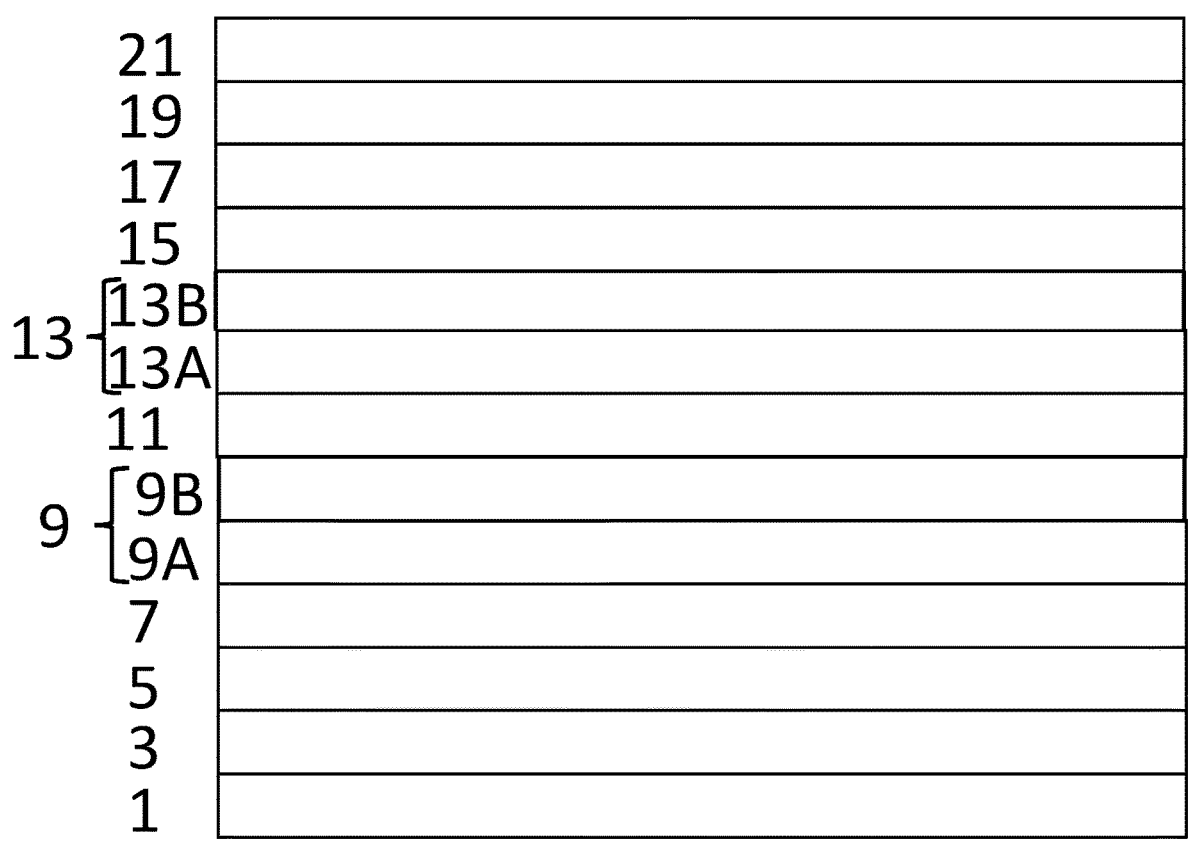
FIG. 3 shows a schematic diagram for a stacked OLED device 300 according to the invention.

FIG. 3 illustrates a spectrally-tunable OLED lighting device 300. This embodiment is the same as 200 shown in FIG. 2 except that the yellow light-emitting unit 13 has two separate and adjacent light-emitting layers 13A and 13B. This allows for increased yellow emission from the yellow light-emitting unit 13. In some related embodiments, there may be a non-emitting interlayer between 13A and 13B. The interlayer may only have one material, either a hole-transporting material or an electron-transporting material, or a mixture of the two materials.

In one embodiment of 300, 13A and 13B (which make up the yellow light-emitting unit 13) are adjacent yellow light-emitting OLED layers that each consists essentially of a green phosphorescent emitter, a red phosphorescent emitter and a single non-emitting host. 13A and 13B may have the same formulation or may have different formulations from each other.

In another embodiment of 300, 13A (closer to mixed interlayer 11) is a green phosphorescent light-emitting layer and 13B (further from the mixed interlayer 11) is an adjacent red phosphorescent light-emitting layer. Together, these represent the yellow light-emitting unit 13. In this embodiment, 13A and 13B each have a single non-emitting host that is the same in both 13A and 13B. In some cases, the host in 13A and 13B can be different or there can be multiple hosts. It is also possible that 13A is a red-emitting LEL and 13B is the green-emitting LEL. By dividing the yellow light-emitting unit 13 into separate red and green LELs, greater control over the relative amounts of red and green light can be obtained.

Although 300 in FIG. 3 is shown as having the blue light-emitting unit 9 as two separate and adjacent blue light-emitting layers 9A and 9B, the blue light-emitting unit 9 can be a single blue LEL as shown in 100 in FIG. 1.

Figure 4:
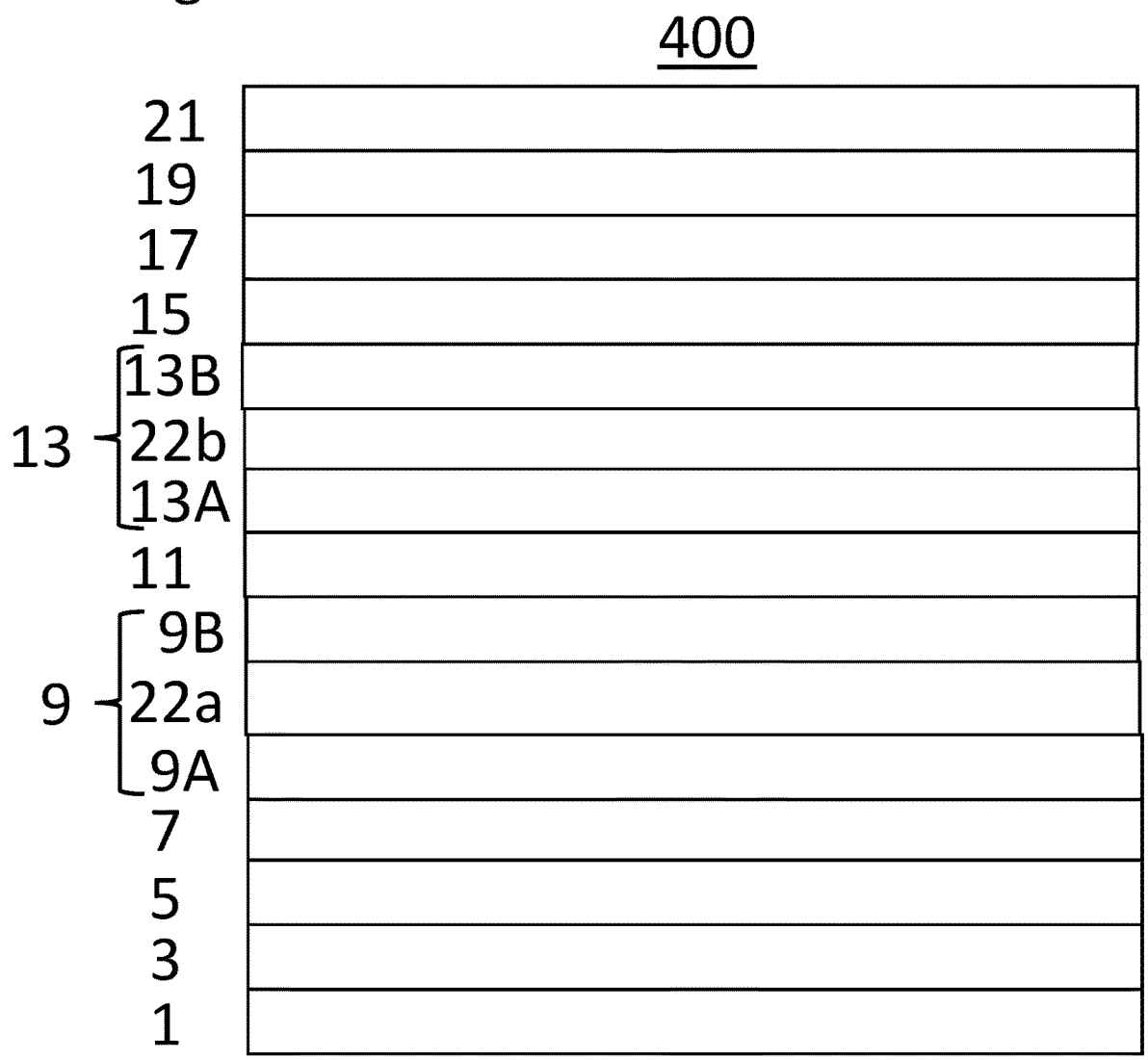
FIG. 4 shows a schematic diagram for a stacked OLED device 400 according to the invention.

FIG. 4 illustrates a spectrally-tunable OLED lighting device 400. This embodiment is related to 300 shown in FIG. 3 where the blue light-emitting unit 9 has two blue light-emitting layers 9A and 9B and the yellow light-emitting unit 13 has two separate and adjacent light-emitting layers 13A and 13B. In 400, 9A and 9B are separated by non-emitting interlayer 22a and 13A and 13B are separated by non-emitting interlayer 22b. Interlayers 22a and 22b are considered part of their respective units and may have the same or different formulations. The blue light-emitting unit 9 and the yellow light-emitting unit 13 are separated by 11, which is a non-emitting mixed interlayer.

Figure 5:
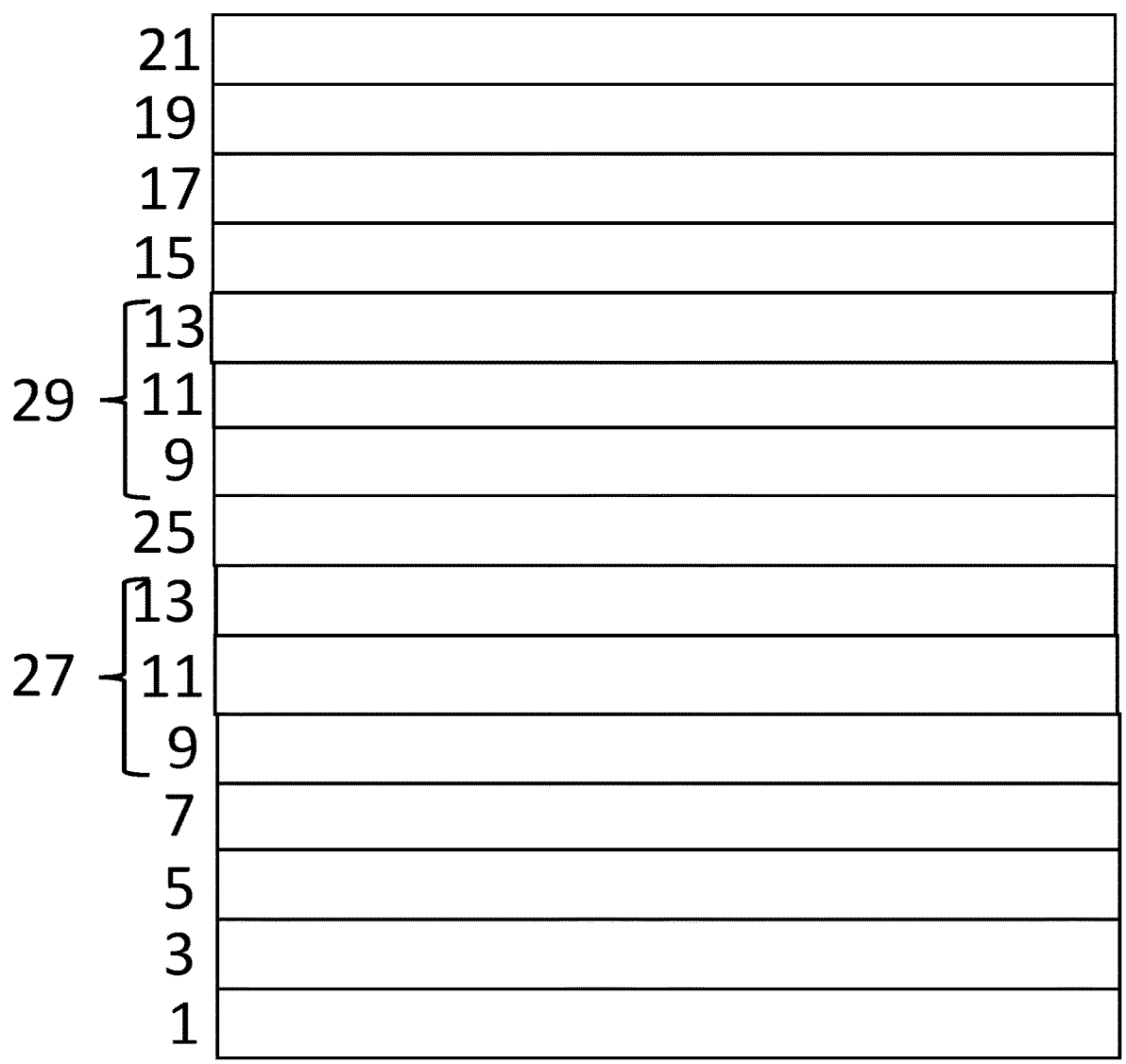
FIG. 5 shows a schematic diagram for a stacked OLED device 500 according to the invention.

FIG. 5 illustrates a spectrally-tunable OLED lighting device 500. This embodiment has two white (B+Y) light-emitting OLED units 27 and 29 that are separated by charge-generating layer 25. The first white light-emitting OLED unit 27 consists of a blue light-emitting OLED unit 9 and a yellow light-emitting unit 13 separated by a mixed interlayer 11. The second white light white light-emitting OLED unit 29 consists of a blue light-emitting OLED unit 9 and a yellow light-emitting unit 13 separated by a mixed interlayer 11. The formulations of the blue light-emitting units 9, the yellow light-emitting units 13, or the mixed interlayers 11 in the white OLED units 27 and 29 may be the same or different.

Because of the number of stacked light-emitting layers and the need to minimize voltage in an OLED with multiple light-emitting layers, it is often desirable to include charge-generation layers (CGL) such as 25, also sometimes referred to as connector or intermediate layers, to minimize voltage increase when using multiple light-emitting stacks in the embodiments of FIG. 5. In particular, it is desirable that a CGL is located between each white light-emitting unit within the stack, and also desirable that the CGL has an HTL on one side and an ETL on the opposite side. It is generally not necessary to locate a CGL between a light-emitting layer and an electrode, but in special circumstances such an application of a CGL could be advantaged.

A charge-generation layer (which may be composed of more than one layer) or unit has the ability to generate both holes and electrons. Often, a CGL has a n-layer (which may be doped with an electron-generating n-dopant) that can generate electrons when subjected to an electrical bias and a p-layer (which may be doped with an electron-poor p-dopant) that can accept electrons. In some instances, the n-layer and p-layer may be separated by a thin intermediate layer. Often, the CGL is arranged so that the n-layer is closer to the anode and the p-layer is closer to the cathode.

A desirable formulation for a CGL has three layers; an electron-transport material doped with a n-dopant (for example, Li), a thin intermediate layer of the same electron-transport material, and a hole-transport material doped with a p-dopant. Suitable electron-transport and hole-transport materials, along with n-dopants and p-dopants suitable for use in a CGLs such as 25 are well-known and commonly used. The materials may be organic or inorganic. The choice of appropriate materials is not critical and any may be selected based on their performance.

The thickness of the CGL should desirably be in the range of 200-450 Å. In many instances, the CGL will have an ETL on the anode side and an HTL on its cathode side to help improve charge transport and help separate the charge-generating dopants (if present) from the LELs.

It should be noted that the mixed interlayer (i.e. 11) which separates the B and Y layers or units in the invention is different in formulation and purpose from a CGL (i.e. 25). The purpose of a CGL is to act as an internal electrode and act as an internal source of holes and electrons when an electrical field is applied. The purpose of the mixed interlayer is to control the charge carriers flowing between the B and Y units in order to manipulate the relative amounts of B and Y light produced according to the amount of power applied.

In FIG. 5, there are multiple mixed interlayers that have been designated as 11. In embodiments with multiple mixed interlayers in different locations, the mixed interlayers 11 can have the same exact formulation or can have a different formulation. In case of multiple mixed interlayers, the desirable Triplet Energies, HOMO and LUMO relationships apply only to the neighboring blue and yellow light-emitting layers or units.

Generally speaking, the luminance ("brightness") of an OLED is directly proportional to the amount of power (voltage and current) applied to the OLED electrodes. More power creates higher luminance. OLEDs are generally current-driven devices. For spectrally-tunable OLEDs, it is often desired that the "color" of the light emitted changes as the luminance changes. However, in some applications, it would be desirable that the brightness of both the "cool" and "warm" emissions be the same. This can be accomplished by using PWM (pulse width modulation) when driving the OLED. At one "color" of light, the OLED is driven at the appropriate power level to achieve the desired emission color and the overall amount of light emitted (over a chosen time period smaller than the response time of the human vision system) is controlled by adjusting the time the OLED is turned on and off. Likewise, at another "color" of light where the OLED is driven at a different power level, the on/off time period of the OLED is adjusted that the overall brightness remains the same (even though the luminance of the OLED has changed).

Experimental Results

In the following examples, the numbers before each material (e.g. 130 ITO) are physical layer thicknesses in Angstroms unless otherwise noted. All % are by weight. All devices used glass as the substrate and were encapsulated after deposition of the cathode using the same procedures for all examples.

OLED Format A (see FIG. 1):
Layer 1 (Transparent Anode): 1400 ITO
Layer 2 (HIL): 100 Hole-Injection Material HIL1
Layer 3 (HTL1): 2000 Hole-Transporting Material HTM1
Layer 4 (HTL2): 100 HTM2
Layer 5 (Blue LEL): 150 Blue Host BH1+4% Fluorescent Blue Dopant BD1
Layer 6 (Mixed Interlayer): 50 (HTM1+Electron-Transporting Material ETM1)
Layer 7 (Yellow LEL): 200 (Green Host GH1+Phosphorescent Green Dopant GD1+Phosphorescent Red Dopant RD1)
Layer 8 (ETL): 300 ETM2
Layer 9 (EIL): 50 ETM3+2% Li
Layer 10 (Reflective Cathode): 1400 Ag Note that in this example, the B unit consists of a single B LEL and the Y unit consists of a single Y LEL that are separated by a mixed interlayer; together, layers 5-7 form a white (W) light-emitting unit. In a first series, variations as shown in Table 1 were made in Layer 6 (Mixed Interlayer) which had a thickness of 50 Å.

TABLE 1

Variations in Mixed Interlayer for Devices A1-A5

| Device | % HTM1 | % ETM1 | I* | V* | L* | CIEx | CIEy | EQE |
|--------|--------|--------|----|------|-------|-------|-------|-------|
| A1 | 90% | 10% | 1 | 4.08 | 33.76 | 0.343 | 0.333 | 16.80 |
|  |  |  | 3 | 4.67 | 27.36 | 0.314 | 0.309 | 14.10 |
|  |  |  | 10 | 5.85 | 20.00 | 0.294 | 0.291 | 10.60 |
| A2 | 92% | 8% | 1 | 4.22 | 37.49 | 0.393 | 0.381 | 17.30 |
|  |  |  | 3 | 4.85 | 30.03 | 0.366 | 0.360 | 14.20 |
|  |  |  | 10 | 6.06 | 21.49 | 0.345 | 0.345 | 10.30 |
| A3 | 94% | 6% | 1 | 4.33 | 41.13 | 0.396 | 0.388 | 18.50 |
|  |  |  | 3 | 4.98 | 32.87 | 0.368 | 0.365 | 15.20 |
|  |  |  | 10 | 6.23 | 22.79 | 0.348 | 0.349 | 10.70 |
| A4 | 96% | 4% | 1 | 4.75 | 45.86 | 0.456 | 0.444 | 19.30 |
|  |  |  | 3 | 5.50 | 36.13 | 0.435 | 0.430 | 15.30 |
|  |  |  | 10 | 6.82 | 23.68 | 0.419 | 0.419 | 10.10 |
| A5 | 98% | 2% | 1 | 4.83 | 53.12 | 0.479 | 0.480 | 20.90 |
|  |  |  | 3 | 5.61 | 41.57 | 0.464 | 0.473 | 16.30 |
|  |  |  | 10 | 6.97 | 27.04 | 0.450 | 0.465 | 10.60 |

Figure 6:
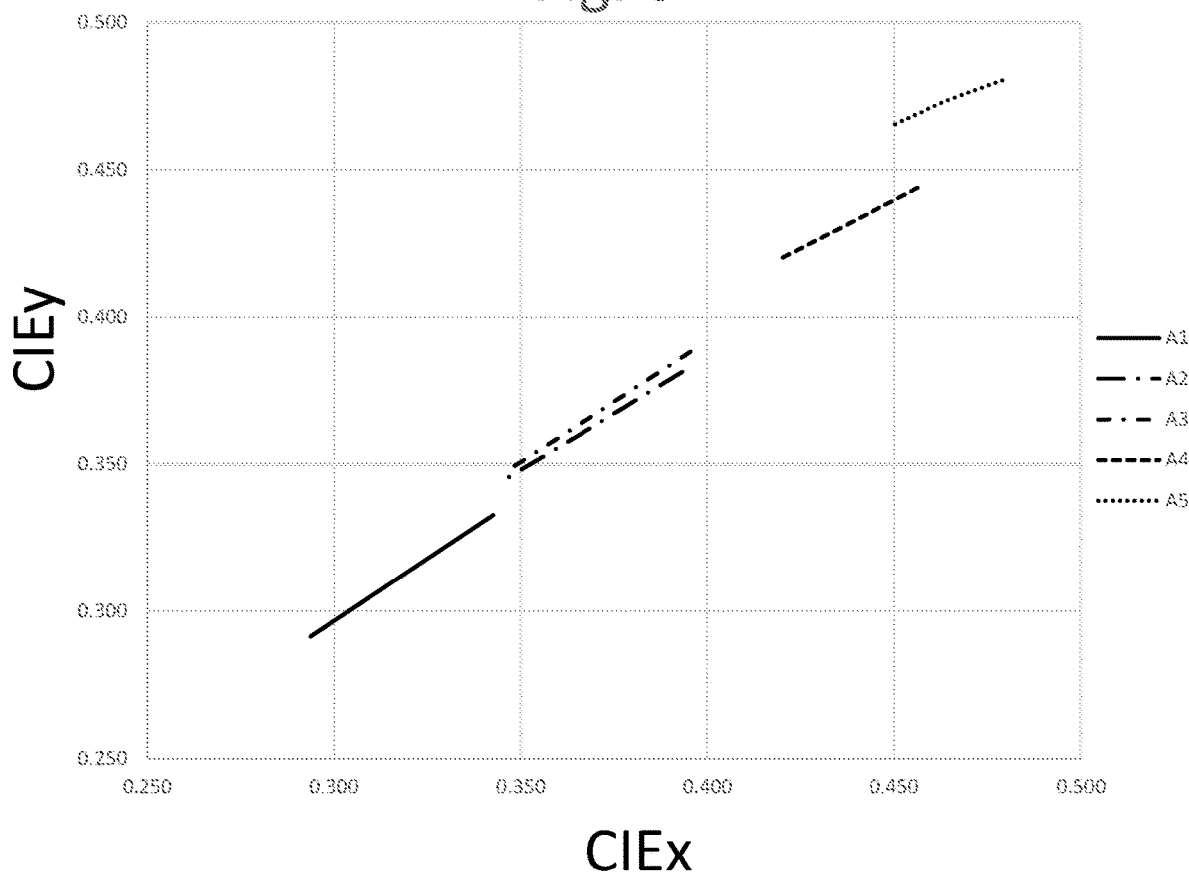
FIG. 6 shows a plot of CIEx vs CIEy values for OLED devices A1-A5.

*All devices had 10% GD1 and 0.35% RD1 in Layer 7 (Yellow LEL)
I = current in mA/cm$^2$
V = initial voltage
L = Luminance in cd/A As can be seen in FIG. 6, the shift in color temperature (as measured by plotting $CIE_x$ vs $CIE_y$) for devices A1-A5 is linear as a function of the current applied. Table 2 shows the effect of color temperature (CCT) as a function of the applied current for devices A1-A5:

TABLE 2

CCT and Duv for Devices A1-A5

| Device | I | CCT | Duv |
|--------|----|------|---------|
| A1 | 1 | 5040 | −0.0088 |
|  | 3 | 6592 | −0.0084 |
|  | 10 | 8496 | −0.0064 |
| A2 | 1 | 3707 | −0.0014 |
|  | 3 | 4328 | −0.0035 |
|  | 10 | 4970 | −0.0037 |
| A3 | 1 | 3705 | 0.0011 |
|  | 3 | 4285 | −0.0016 |
|  | 10 | 4885 | −0.0024 |

TABLE 2-continued

CCT and Duv for Devices A1-A5

| Device | I | CCT | Duv |
|---|---|---|---|
| A4 | 1 | 2999 | 0.0124 |
|  | 3 | 3228 | 0.0104 |
|  | 10 | 3440 | 0.0092 |
| A5 | 1 | 2935 | 0.022 |
|  | 3 | 3088 | 0.0216 |
|  | 10 | 3233 | 0.0208 |

Figure 7:
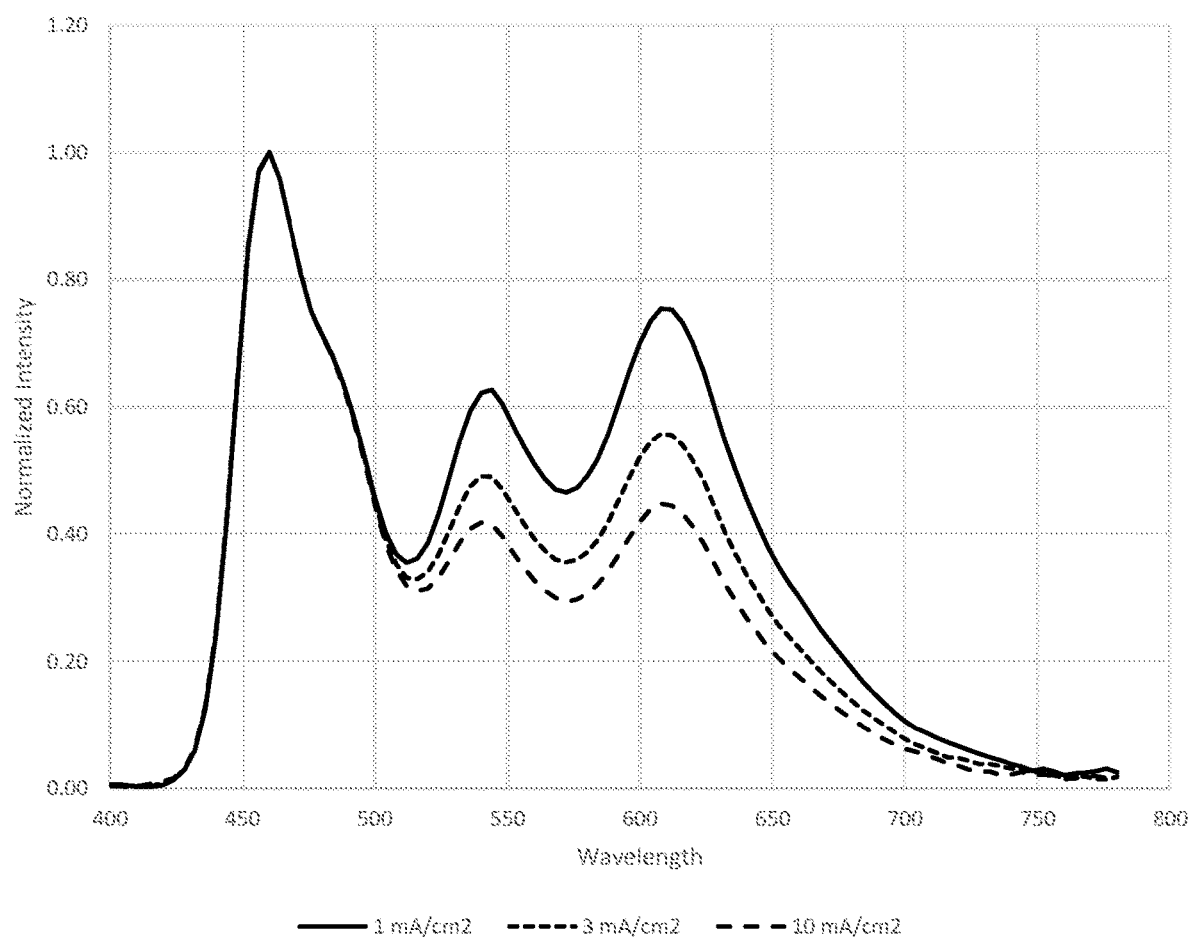
FIG. 7 shows a normalized spectral plot of OLED device A1 at three different current levels.

As can be seen in Table 2, the devices of the invention are spectrally-tunable; they all exhibit a "warmer" color temperature when a lower current is applied and a "colder" color temperature at higher current levels. As can be seen in FIG. 7 for device A1, the ratio of luminance at 460 nm/620 nm changes from 1.43 (1 mA/cm2) to 1.94 (3 mA/cm2) to 2.43 (10 mA/cm2).

In a second series, variations in thickness of Layer 6 (Mixed Interlayer) which had 94% HTM1/6% ETM1 are shown in Table 3.

TABLE 3

Variations in Thickness of Mixed Interlayer

| Device | Thickness | I* | V* | L* | CIEx | CIEy | EQE |
|---|---|---|---|---|---|---|---|
| A6 | 25 | 1 | 4.09 | 34.87 | 0.363 | 0.346 | 17.00 |
|  |  | 3 | 4.69 | 27.93 | 0.333 | 0.322 | 14.10 |
|  |  | 10 | 5.87 | 19.23 | 0.310 | 0.302 | 10.00 |
| A3 | 50 | 1 | 4.33 | 41.13 | 0.396 | 0.388 | 18.50 |
|  |  | 3 | 4.98 | 32.87 | 0.368 | 0.365 | 15.20 |
|  |  | 10 | 6.23 | 22.79 | 0.348 | 0.349 | 10.70 |
| A7 | 75 | 1 | 4.45 | 45.01 | 0.434 | 0.428 | 19.30 |
|  |  | 3 | 5.14 | 36.30 | 0.414 | 0.415 | 15.70 |
|  |  | 10 | 6.44 | 25.21 | 0.403 | 0.409 | 10.90 |

*All devices had 10% GD1 and 0.35% RD1 in Layer 7 (Yellow LEL)
I = current in mA/cm²
V = initial voltage
L = Luminance in cd/A

TABLE 4

CCT and Duv for Variations in Thickness of Mixed Interlayer

| Device | I | CCT | Duv |
|---|---|---|---|
| A6 | 1 | 4342 | −0.0092 |
|  | 3 | 5468 | −0.0104 |
|  | 10 | 6952 | −0.0097 |
| A7 | 1 | 3705 | 0.0011 |
|  | 3 | 4285 | −0.0016 |
|  | 10 | 4885 | −0.0024 |
| A9 | 1 | 3233 | 0.0098 |
|  | 3 | 3498 | 0.0083 |
|  | 10 | 3680 | 0.0082 |

As can be seen in Table 4, the devices of the invention are spectrally-tunable; they all exhibit a "warmer" color temperature when a lower current is applied and a "colder" color temperature at higher current levels.

In a third series, variations as shown in Table 5 were made in Layer 7 (Yellow LEL) which had 10% GD1 and the indicated % of RD1.

TABLE 5

Variations in Yellow LEL (Layer 7)

| Device | % RD1 | I* | V* | L* | CIEx | CIEy | EQE |
|---|---|---|---|---|---|---|---|
| A8 | 0.30 | 1 | 4.28 | 44.48 | 0.411 | 0.424 | 18.40 |
|  |  | 3 | 4.91 | 35.31 | 0.386 | 0.403 | 15.00 |
|  |  | 10 | 6.09 | 25.17 | 0.368 | 0.389 | 10.90 |
| A3 | 0.35 | 1 | 4.33 | 41.13 | 0.396 | 0.388 | 18.50 |
|  |  | 3 | 4.98 | 32.87 | 0.368 | 0.365 | 15.20 |
|  |  | 10 | 6.23 | 22.79 | 0.348 | 0.349 | 10.70 |
| A9 | 0.40 | 1 | 4.15 | 43.85 | 0.430 | 0.408 | 19.80 |
|  |  | 3 | 4.74 | 35.05 | 0.400 | 0.387 | 16.10 |
|  |  | 10 | 5.81 | 26.12 | 0.377 | 0.370 | 12.20 |

*All devices had 94% HTM1/6% ETM1 in Layer 6 (Mixed Interlayer) at a thickness of 50
I = current in mA/cm²
V = initial voltage
L = Luminance in cd/A

TABLE 6

CCT and Duv for Variations in Yellow LEL (Layer 7)

| Device | I | CCT | Duv |
|---|---|---|---|
| A8 | 1 | 3615 | 0.0125 |
|  | 3 | 4021 | 0.0103 |
|  | 10 | 4413 | 0.0093 |
| A3 | 1 | 3705 | 0.0011 |
|  | 3 | 4285 | −0.0016 |
|  | 10 | 4885 | −0.0024 |
| A9 | 1 | 3160 | 0.0026 |
|  | 3 | 3587 | −0.0007 |
|  | 10 | 4041 | −0.0023 |

As can be seen in Table 6, the devices of the invention are spectrally-tunable; they all exhibit a "warmer" color temperature when a lower current is applied and a "colder" color temperature at higher current levels.

To further demonstrate the advantages, OLED Format B (see FIG. 5) was prepared as follows:
Layer 1 (Transparent Anode): 1400 ITO
Layer 2 (HIL): 100 HTM1+6% p-dopant
Layer 3 (HTL1): 3000 HTM1
Layer 4 (HTL2): 100 HTM2
Layer 5 (Blue LEL): 150 Blue Host BH1+5% Fluorescent Blue Dopant BD2
Layer 6 (Mixed Interlayer): 40 (HTM1+Electron-Transporting Material ETM1)
Layer 7 (Yellow LEL): 200 (Green Host GH1+Phosphorescent Green Dopant GD1+Phosphorescent Red Dopant RD1)
Layer 8 (ETL): 200 ETM2
Layers 9 (CGL): 50 ETM3+2% Li/25 ETM3/100 HTM1+6% p-dopant/300 HTM1/100 HTM2
Layer 11 (Blue LEL): 150 Blue Host BH1+5% Fluorescent Blue Dopant BD2
Layer 12 (Mixed Interlayer): 40 (HTM1+Electron-Transporting Material ETM1)
Layer 13 (Yellow LEL): 200 (Green Host GH1+Phosphorescent Green Dopant GD1+Phosphorescent Red Dopant RD1)
Layer 14 (ETL); 450 ETM2
Layer 15: 100 ETM3+2% Li
Layer 16: 25 ETM3
Layer 17: 1400 Ag OLED Series B is a 2 stack OLED device, with two white light-emitting (EL) units (layers 5-7 and layers 11-13) separated by a CGL (layers 9). Each EL unit has a B LEL and Y LEL separated by a mixed interlayer. The Y LEL has a green light-emitting dopant, a red light-emitting dopant and a single non-emitting host.

In a first series, variations as shown in Table 7 were made in Layers 6 and 12 (Mixed Interlayer), both having a thickness of 40 Å. In Devices B1-B3, the % of RD2 in Layers 7 and 13 (Yellow LEL) was 0.4%; in Devices B4-B6, the % of RD2 in Layers 7 and 13 was 0.7% (GD1 at 10% in all examples).

TABLE 7

Variations in Mixed Interlayer for Devices B1-B6

| Device | % HTM1 | % ETM1 | I* | V* | L* | CIEx | CIEy | EQE |
|---|---|---|---|---|---|---|---|---|
| B1 | 85% | 15% | 1 | 7.2 | 74.7 | 0.337 | 0.428 | 29.8 |
|  |  |  | 3 | 7.9 | 64.5 | 0.306 | 0.405 | 26.7 |
|  |  |  | 10 | 9.2 | 56.5 | 0.278 | 0.384 | 24.2 |
| B2 | 90% | 10% | 1 | 7.4 | 87.5 | 0.383 | 0.469 | 32.6 |
|  |  |  | 3 | 8.2 | 73.3 | 0.352 | 0.448 | 28.1 |
|  |  |  | 10 | 9.6 | 61.5 | 0.322 | 0.426 | 24.4 |
| B3 | 95% | 5% | 1 | 12.8 | 100.2 | 0.426 | 0.509 | 35 |
|  |  |  | 3 | 8.3 | 81.3 | 0.402 | 0.496 | 28.6 |
|  |  |  | 10 | 14.6 | 64.7 | 0.375 | 0.477 | 23.3 |
| B4 | 85% | 15% | 1 | 6.2 | 51.5 | 0.335 | 0.379 | 24.6 |
|  |  |  | 3 | 6.7 | 46.3 | 0.299 | 0.363 | 22.4 |
|  |  |  | 10 | 7.2 | 42.1 | 0.268 | 0.348 | 20.6 |
| B5 | 90% | 10% | 1 | 7.4 | 74.5 | 0.415 | 0.437 | 32.3 |
|  |  |  | 3 | 8.2 | 63.2 | 0.376 | 0.419 | 27.7 |
|  |  |  | 10 | 9.6 | 53.6 | 0.338 | 0.400 | 23.8 |
| B6 | 95% | 5% | 1 | 7.7 | 84.3 | 0.467 | 0.475 | 34.6 |
|  |  |  | 3 | 8.6 | 69.9 | 0.438 | 0.467 | 28.4 |
|  |  |  | 10 | 10.1 | 56.2 | 0.406 | 0.452 | 23 |

*I = current in mA/cm$^2$
V = initial voltage
L = Luminance in cd/A

Figure 8:
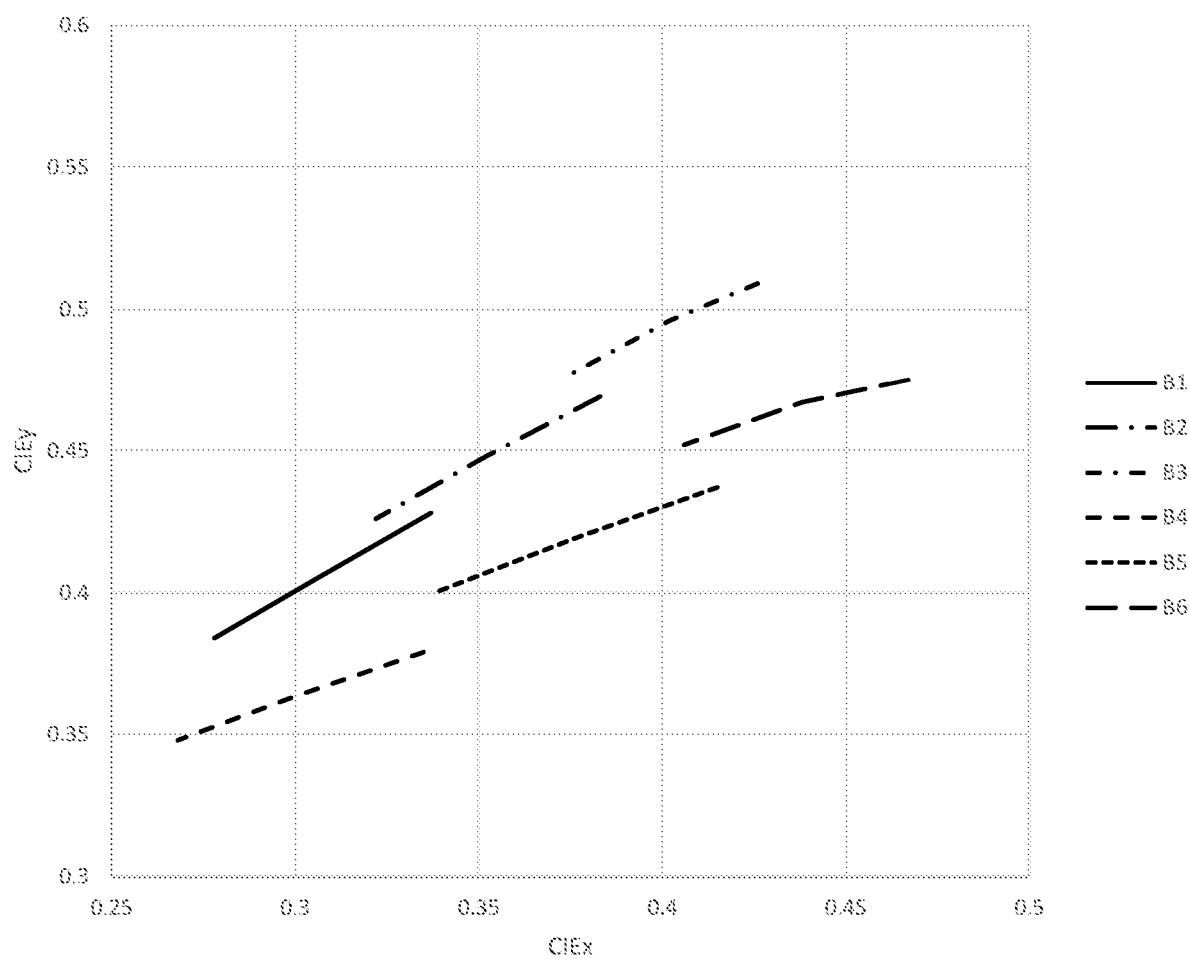
FIG. 8 shows a plot of CIEx vs CIEy values for OLED devices B1-B6.

As can be seen in FIG. 8, the shift in color temperature (as measured by plotting $CIE_x$ vs $CIE_y$) for devices B1-B6 is linear as a function of the current applied. Note that the slope of the dependence is different for B1-B3 (with a lower % or red dopant present in the yellow LEL) and B4-B6 (with a higher % of red dopant). Table 8 shows the effect of color temperature (CCT) as a function of the applied current for devices B1-B6:

TABLE 8

CCT and Duv for Devices B1-B6

| Device | I | CCT | Duv |
|---|---|---|---|
| B1 | 1 | 5387 | 0.0368 |
|  | 3 | 6400 | 0.041 |
|  | 10 | 7671 | 0.0449 |
| B2 | 1 | 4391 | 0.0368 |
|  | 3 | 5018 | 0.039 |
|  | 10 | 5825 | 0.0418 |
| B3 | 1 | 3819 | 0.0401 |
|  | 3 | 4148 | 0.041 |
|  | 10 | 4587 | 0.0423 |
| B4 | 1 | 5412 | 0.017 |
|  | 3 | 6932 | 0.026 |
|  | 10 | 8783 | 0.0352 |
| B5 | 1 | 3635 | 0.017 |
|  | 3 | 4358 | 0.020 |
|  | 10 | 5318 | 0.0249 |
| B6 | 1 | 3058 | 0.0218 |
|  | 3 | 3418 | 0.023 |
|  | 10 | 3891 | 0.0251 |

As can be seen in Table 8, the devices of the invention are spectrally-tunable; they all exhibit a "warmer" color temperature when a lower current is applied and a "colder" color temperature at higher current levels.

In a second series (OLED Format B), variations as shown in Table 9 were made in Layers 7 and 13 (Yellow LEL). The % HTM1/% ETM1 was 90/10 and GD1 was 10% in all devices.

TABLE 9

Variations in Yellow LEL in Format B

| Device | % RD2 | I* | V* | L* | CIEx | CIEy | EQE |
|---|---|---|---|---|---|---|---|
| B2 | 0.4% | 1 | 7.4 | 87.5 | 0.383 | 0.469 | 32.6 |
|  |  | 3 | 8.2 | 73.3 | 0.352 | 0.448 | 28.1 |
|  |  | 10 | 9.6 | 61.5 | 0.322 | 0.426 | 24.4 |
| B5 | 0.7% | 1 | 7.4 | 74.5 | 0.415 | 0.437 | 32.3 |
|  |  | 3 | 8.2 | 63.2 | 0.376 | 0.419 | 27.7 |
|  |  | 10 | 9.6 | 53.6 | 0.338 | 0.400 | 23.8 |
| B7 | 1% | 1 | 7.5 | 62.0 | 0.435 | 0.412 | 30.1 |
|  |  | 3 | 8.3 | 53.7 | 0.391 | 0.398 | 25.9 |
|  |  | 10 | 9.6 | 46.5 | 0.349 | 0.382 | 22.5 |
| B8 | 1.5% | 1 | 7.5 | 56.0 | 0.466 | 0.387 | 31.6 |
|  |  | 3 | 8.3 | 49.4 | 0.417 | 0.376 | 27.2 |
|  |  | 10 | 9.7 | 43.44 | 0.372 | 0.364 | 23.4 |

*I = current in mA/cm$^2$
V = initial voltage
L = Luminance in cd/A

Figure 9:
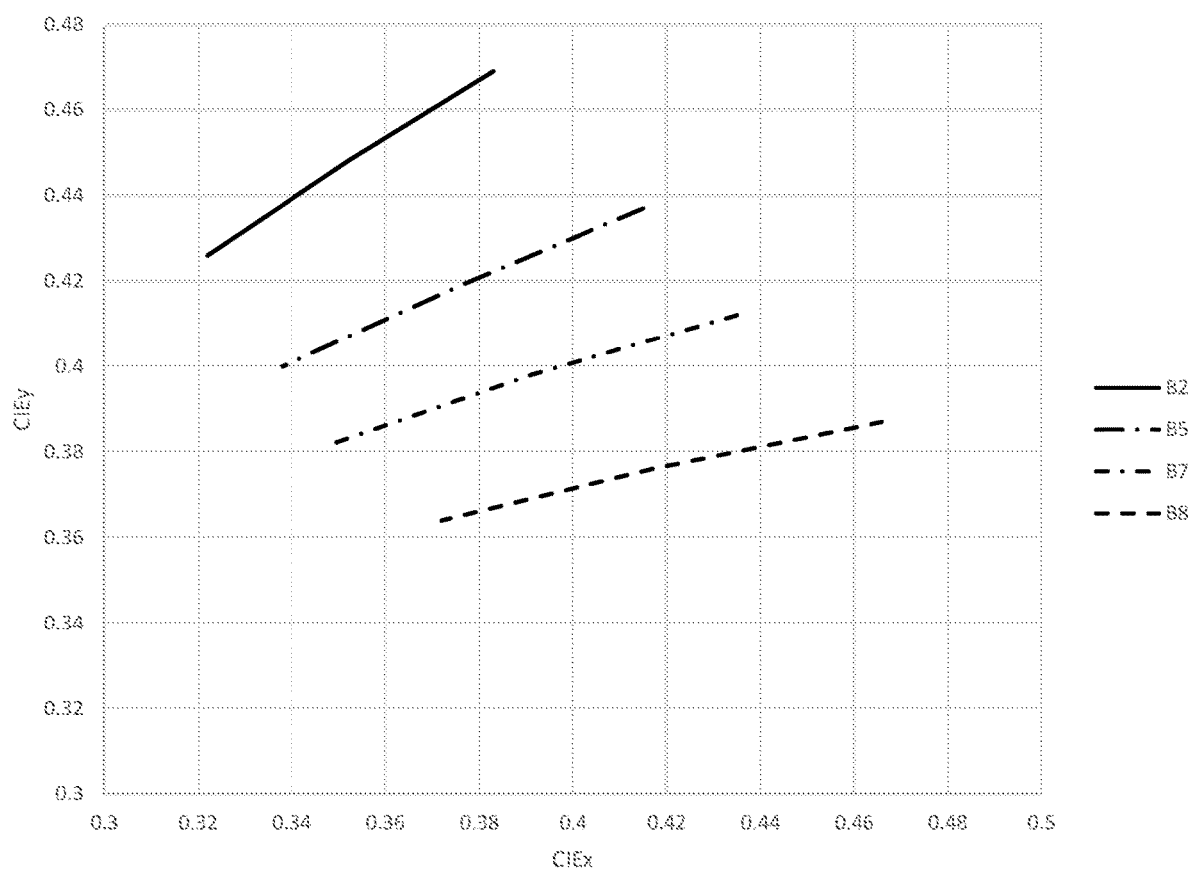
FIG. 9 shows a plot of CIEx vs CIEy values for OLED devices B2, B5, B7 and B8.

As can be seen in FIG. 9, the shift in color temperature (as measured by plotting $CIE_x$ vs $CIE_y$) for devices in Table 9 is linear as a function of the current applied. Note that the slope of the dependence is dependent on the % of red dopant in the yellow LEL. Table 10 shows the effect of color temperature (CCT) as a function of the applied current for devices in Table 9:

TABLE 10

CCT and Duv for Y LEL in Format B

| Device | I | CCT | Duv |
|---|---|---|---|
| B2 | 1 | 4391 | 0.0368 |
|  | 3 | 5018 | 0.039 |
|  | 10 | 5825 | 0.0418 |
| B5 | 1 | 3635 | 0.017 |
|  | 3 | 4358 | 0.020 |
|  | 10 | 5318 | 0.0249 |
| B7 | 1 | 3113 | 0.0038 |
|  | 3 | 3883 | 0.007 |
|  | 10 | 4942 | 0.0131 |
| B8 | 1 | 2416 | −0.0093 |
|  | 3 | 3125 | −0.009 |
|  | 10 | 4157 | −0.0033 |

As can be seen in Table 10, the devices of the invention are spectrally-tunable; they all exhibit a "warmer" color temperature when a lower current is applied and a "colder" color temperature at higher current levels.

The above examples clearly demonstrate that the spectral-tuning of the stacked OLED devices according to the applied current can be adjusted to the desired levels by controlling the ratio of the hole-transporting material to electron-transporting material in the mixed interlayer as well as the % of the phosphorescent red dopant in the yellow emitting LEL.

The following is a listing of electronic properties of some of the materials used in the examples:

| Material | Function | HOMO (eV) | LUMO (eV) | Triplet Energy |
|---|---|---|---|---|
| GH1 | Y LEL Host | −4.99 | −1.96 | 2.58 |
| GD1 | G Ph Dopant | −5.1 | −2.8 | 2.3 |
| RD1 | R Ph Dopant | −5.1 | −3.1 | 2 |

-continued

| Material | Function | HOMO (eV) | LUMO (eV) | Triplet Energy |
|---|---|---|---|---|
| ETM1 | ETL | −6.2 | −2.7 | 2.7 |
| ETM2 | ETL | −6.0 | −3.0 | 1.8 |
| ETM3 | ETL | −5.9 | −2.9 | |
| HTM1 | HTL/Interlayer | −5.16 | −2.04 | 2.45 |
| HTM2 | HTL | −5.26 | −2.1 | 2.66 |
| BH1 | Blue LEL Host | −6.0 | −3.0 | 1.8 |
| BD1 | B Fl Dopant | −5.6 | −2.8 | |
| BD2 | B Fl Dopant | −5.1 | −2.3 | |

It should be noted that the Triplet Energy of both the materials in the mixed interlayer (HTM1 and ETM1) are higher than the Triplet Energies of the R and G phosphorescent dopants (GD1 and RD1) in the Y LEL.

It should also be noted that the HOMOs of the materials in the mixed interlayer (HTM1 and ETM1) are more negative than the HOMO of the host in the Y LEL (GH1) but less negative than the HOMO of the host in the B LEL (BH1). Moreover, the LUMOs of the materials in the mixed interlayer (HTM1 and ETM1) are more negative than the LUMO of the host in the Y LEL (GH1) but less negative than the LUMO of the host in the B LEL (BH1) as well.

In order to show the importance of the emitting layers in providing the desired spectrally tunable OLED, non-inventive OLED Format C were prepared as follows:

Layer 1 (Transparent Anode): 1400 ITO
Layer 2 (HIL): 100 Hole-Injection Material HIL1
Layer 3 (HTL): 1500 Hole-Transporting Material HTM1
Layer 4 (Green LEL): 200 (80% Green Host GH1+10% co-host GH2+10% GD1)
Layer 5 (Mixed Interlayer): 50 (Green Host GH1+% (see Table 11) co-host GH2)
Layer 6 (Blue LEL): 150 Blue Host BH1+4% Fluorescent Blue Dopant BD1
Layer 7 (ETL1): 150 ETM1
Layer 8 (ETL2): 50 ETM3
Layer 9 (EIL): 100 ETM3+2% Li
Layer 10 (Reflective Cathode): 1400 Ag Results for OLED Series C are shown in Tables 11 and 12.

TABLE 11

Variations in Mixed Interlayer for OLED Series C

| Device | % GH2 in IL | I* | V* | L* | CIEx | CIEy | EQE |
|---|---|---|---|---|---|---|---|
| C1 | 0% | 1 | 4.11 | 107.30 | 0.462 | 0.527 | 33.60 |
| | | 3 | 4.25 | 100.80 | 0.461 | 0.528 | 31.50 |
| | | 10 | 4.44 | 85.12 | 0.458 | 0.528 | 26.60 |
| C4 | 25% | 1 | 3.44 | 103.10 | 0.464 | 0.527 | 32.30 |
| | | 3 | 3.49 | 97.50 | 0.463 | 0.528 | 30.60 |
| | | 10 | 3.46 | 83.22 | 0.461 | 0.529 | 26.00 |
| C3 | 50% | 1 | 3.45 | 108.70 | 0.461 | 0.530 | 33.90 |
| | | 3 | 3.57 | 102.60 | 0.461 | 0.530 | 31.90 |
| | | 10 | 3.63 | 85.58 | 0.459 | 0.531 | 26.50 |
| C5 | 75% | 1 | 3.27 | 107.40 | 0.462 | 0.529 | 33.40 |
| | | 3 | 3.30 | 101.40 | 0.461 | 0.530 | 31.50 |
| | | 10 | 3.24 | 84.50 | 0.460 | 0.531 | 26.20 |
| C2 | 100% | 1 | 3.52 | 109.00 | 0.460 | 0.530 | 33.80 |
| | | 3 | 3.64 | 102.90 | 0.460 | 0.531 | 32.00 |
| | | 10 | 3.69 | 85.87 | 0.459 | 0.531 | 26.60 |

*I = current in mA/cm$^2$
V = initial voltage
L = Luminance in cd/A

TABLE 12

CCT and Duv for Variations in B-G OLED Format C

| Device | I | CCT | Duv |
|---|---|---|---|
| C1 | 1 | 3401 | 0.0389 |
| | 3 | 3421 | 0.0392 |
| | 10 | 3454 | 0.0396 |
| C4 | 1 | 3377 | 0.0386 |
| | 3 | 3391 | 0.0388 |
| | 10 | 3418 | 0.0395 |
| C3 | 1 | 3422 | 0.0397 |
| | 3 | 3436 | 0.04 |
| | 10 | 3457 | 0.0405 |
| C5 | 1 | 3418 | 0.0395 |
| | 3 | 3426 | 0.0398 |
| | 10 | 3441 | 0.0402 |
| C2 | 1 | 3440 | 0.0401 |
| | 3 | 3443 | 0.0402 |
| | 10 | 3457 | 0.0406 |

OLED Series C is non-inventive because it has a LEL with only 1 dopant with two different non-emitting hosts (one is hole-transporting and the other electron-transporting) separated from a blue LEL by a mixed interlayer. As can be seen in Tables 11 and 12, there is hardly any change in the emitted color of the devices without regard to whether the interlayer has a mixture of two non-emitting charge-carrier materials devices when there is a single dopant.

In order to show the importance of the mixed interlayer in providing the desired spectrally tunable OLED, OLED Format D (white light emitting) were prepared as follows:

Layer 1 (Transparent Anode): 1400 ITO
Layer 2 (HIL): 100 Hole-Injection Material HIL1
Layer 3 (HTL): 1500 Hole-Transporting Material HTM1
Layer 4 (Yellow LEL): 200 (Green Host GH1+10% GD1+0.35% RD-1)
Layer 5 (Mixed Interlayer): 50 (X % HTM1+% ETM1 (see Table 13)
Layer 6 (Blue LEL): 200 Blue Host BH1+4% Fluorescent Blue Dopant BD1
Layer 7 (ETL1): 150 ETM1
Layer 8 (ETL2): 100 ETM3
Layer 9 (EIL): 100 ETM3+2% Li
Layer 10 (Reflective Cathode): 1400 Ag Devices D1-D3 have mixed interlayer of HTM1/ETM1 as one component in the mixed IL. Results for OLED Series D are shown in Tables 13 and 14.

TABLE 13

Variations in Mixed Interlayer for OLED Series D

| Device | % HTM1 in LEL | % ETM1 in IL | I* | V* | L* | CIEx | CIEy | EQE |
|---|---|---|---|---|---|---|---|---|
| D1 (Comp) | 100 | 0 | 1 | 3.7 | 103.2 | 0.187 | 0.178 | 7.5 |
| | | | 3 | 4.1 | 313.6 | 0.196 | 0.185 | 7.5 |
| | | | 10 | 5.2 | 996.1 | 0.208 | 0.195 | 6.8 |
| D2 (Inv) | 95 | 5 | 1 | 3.5 | 512.6 | 0.457 | 0.413 | 23.6 |
| | | | 3 | 4.0 | 1395.0 | 0.440 | 0.403 | 21.4 |
| | | | 10 | 4.9 | 3718.0 | 0.422 | 0.394 | 17.1 |
| D3 (Comp) | 0 | 100 | 1 | 3.5 | 796.1 | 0.532 | 0.462 | 35.3 |
| | | | 3 | 3.9 | 2324.0 | 0.529 | 0.465 | 34.0 |
| | | | 10 | 4.8 | 6418.0 | 0.526 | 0.468 | 27.7 |

*I = current in mA/cm$^2$
V = initial voltage
L = Luminance in cd/A

TABLE 14

CCT and Duv for Variations in OLED Format D

| Device | I | CCT | Duv |
|---|---|---|---|
| D1 | 1 | — | — |
| (Comp) | 3 | — | — |
|  | 10 | — | — |
| D2 | 1 | 2757 | 0.001 |
| (Inv) | 3 | 2949 | −0.0007 |
|  | 10 | 3183 | −0.0019 |
| D3 | 1 | 2274 | 0.014 |
| (Comp) | 3 | 2310 | 0.0147 |
|  | 10 | 2358 | 0.0155 |

Figure 10:
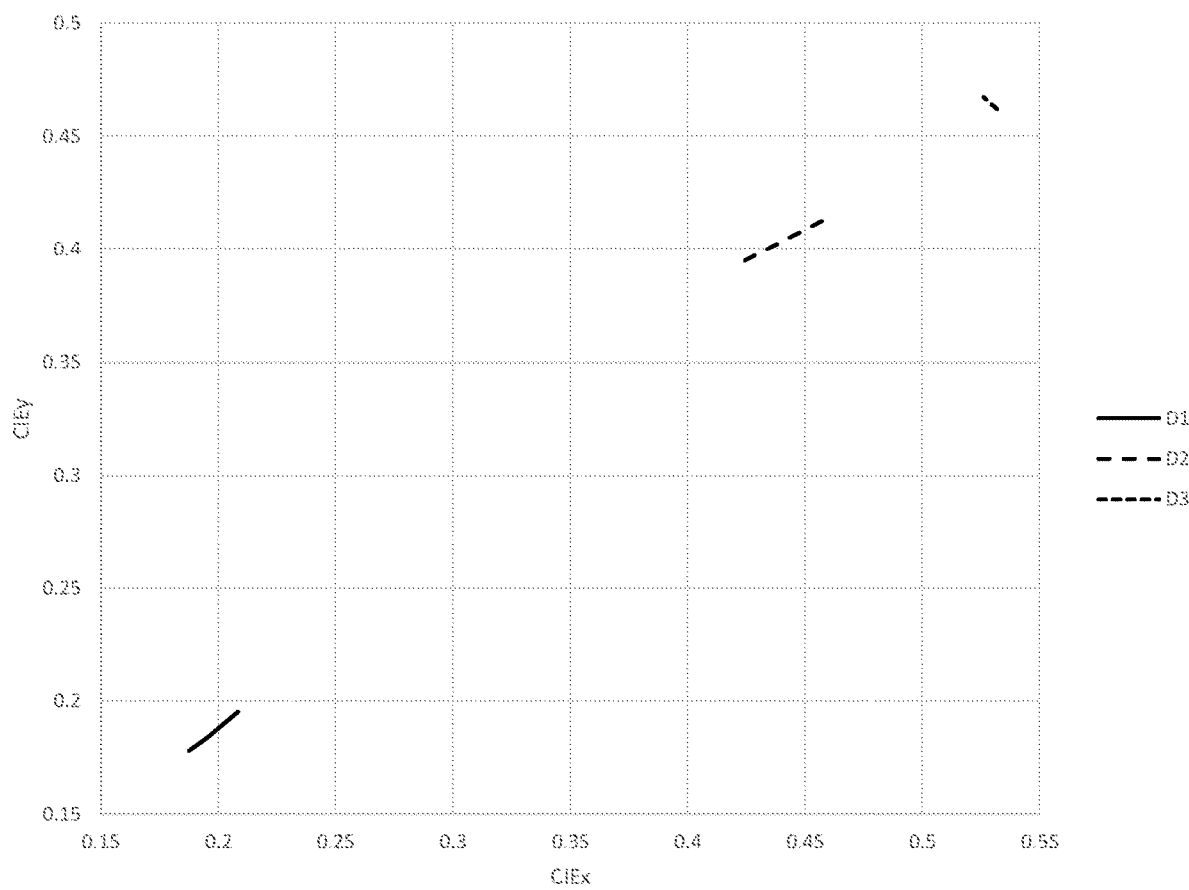
FIG. 10 shows a plot of CIEx vs CIEy for OLED devices D1-D3.

OLED Series D has a Y LEL with a G phosphorescent dopant and a R phosphorescent dopant and a single host. Note that the Y LEL in comparative Device D1, with 100% HTM in the IL, did not effectively emit any G or R light; the emission was predominately from the blue LEL. However, inventive device D2 with a mixture of 95% HTM and 5% ETM had good color and was spectrally tunable (see FIG. 10). Comparative device 3 with 100% ETM did not show much change in color with changes in current.

The above description describes a number of different embodiments. Individual features from any of the embodiments may be combined without limitation.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

The invention claimed is:

1. A spectrally-tunable OLED lighting device comprising:
 a blue light-emitting unit with a blue-light fluorescent, phosphorescent or TADF (thermally active delayed fluorescent) emitter;
 a yellow light-emitting electroluminescent unit comprising a green phosphorescent emitter, a red phosphorescent emitter and at least one non-emitting host; wherein the blue light-emitting unit and the yellow light-emitting unit are separated by an undoped mixed interlayer with two organic non-emitting charge-carrier materials in a single layer; the charge-carrier materials consisting of only one hole-transporting material and only one electron-transporting material, wherein the charge-carrier materials are not electron- or hole-generating materials nor materials that form a charge-transfer complex; and the mixed interlayer contains essentially no other materials.

2. The OLED lighting device of claim 1 wherein the yellow-light emitting unit contains at least one layer that essentially consists of a green phosphorescent emitter, a red phosphorescent emitter and a single non-emitting host.

3. The OLED lighting device of claim 1 where the yellow light-emitting OLED unit comprises at least two light-emitting layers; a first electroluminescent layer comprising a green phosphorescent emitter and a non-emitting host that is directly adjacent or separated by an interlayer to a second electroluminescent layer comprising a red phosphorescent emitter and a non-emitting host.

4. The OLED lighting device of claim 1 wherein the blue light-emitting unit is a single blue light-emitting layer.

5. The OLED lighting device of claim 1 wherein the hole-transporting material represents more than 50% of the materials in the mixed interlayer by weight.

6. The OLED lighting device of claim 1 wherein the Triplet Energy of both materials in the mixed interlayer are higher than the Triplet Energies of the R and G phosphorescent dopants in the neighboring yellow light-emitting unit.

7. The OLED lighting device of claim 1 wherein the HOMOs of both materials in the mixed interlayer are more negative than the HOMO of the host in the neighboring yellow light-emitting unit but less negative than the HOMO of the host in the neighboring blue light-emitting unit.

8. The OLED lighting device of claim 1 wherein the LUMOs of the materials in the mixed interlayer are more negative than the LUMO of the host in the yellow light-emitting unit but less negative than the LUMO of the host in the blue light-emitting unit.

9. A stacked spectrally-tunable OLED lighting device comprising, in order:
 a transparent substrate;
 a transparent anode;
 a blue light-emitting OLED unit with at least one electroluminescent layer with a blue-light fluorescent, phosphorescent or TADF emitter;
 an undoped mixed interlayer with two non-emitting organic charge-carrier materials in a single layer; the charge-carrier materials consisting of only one hole-transporting material and only one electron-transporting material, wherein the charge-carrier materials are not electron- or hole-generating materials nor materials that forms a charge-transfer complex; and the mixed interlayer contains essentially no other materials;
 a yellow light-emitting OLED unit comprising a green phosphorescent emitter, a red phosphorescent emitter and at least one non-emitting host; and
 a reflective cathode.

10. The stacked spectrally-tunable OLED lighting device of claim 9 wherein the yellow light-emitting OLED unit contains at least one layer that essentially consists of a green phosphorescent emitter, a red phosphorescent emitter and a single non-emitting host.

11. The OLED lighting device of claim 9 where the yellow light-emitting OLED unit contains at least two light-emitting layers; the first electroluminescent layer comprising a green phosphorescent emitter and a non-emitting host that is directly adjacent or separated by an interlayer to a second electroluminescent layer comprising a red phosphorescent emitter and a non-emitting host.

12. The stacked spectrally-tunable OLED lighting device of claim 9 wherein the blue light-emitting unit has two or more blue light-emitting electroluminescent layers, each with a blue-light fluorescent, phosphorescent or TADF emitter, that are either directly adjacent or are separated by a non-emitting interlayer.

* * * * *